United States Patent
Shin et al.

(10) Patent No.: US 9,812,446 B2
(45) Date of Patent: Nov. 7, 2017

(54) ELECTRONIC APPARATUS WITH POCKET OF LOW PERMITTIVITY MATERIAL TO REDUCE ELECTROMAGNETIC INTERFERENCE

(71) Applicant: TOYOTA MOTOR ENGINEERING & MANUFACTURING NORTH AMERICA, INC., Erlanger, KY (US)

(72) Inventors: Jongwon Shin, Ann Arbor, MI (US); Chi-Ming Wang, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/085,534

(22) Filed: Mar. 30, 2016

(65) Prior Publication Data
US 2017/0287822 A1  Oct. 5, 2017

(51) Int. Cl.
*H01L 29/76* (2006.01)
*H01L 27/07* (2006.01)
(Continued)

(52) U.S. Cl.
CPC .......... *H01L 27/0711* (2013.01); *H01L 24/32* (2013.01); *H01L 24/48* (2013.01); *H01L 24/73* (2013.01); *H01L 27/0727* (2013.01); *H01L 21/8228* (2013.01); *H01L 23/49562* (2013.01); *H01L 23/49568* (2013.01); *H01L 23/49575* (2013.01); *H01L 23/49582* (2013.01);
(Continued)

(58) Field of Classification Search
CPC ......... H01L 23/49562; H01L 23/49575; H01L 23/49568; H01L 24/32; H01L 24/48; H01L 23/53228; H01L 27/0711; H01L 27/0727; H01L 21/8228
See application file for complete search history.

(56) References Cited

U.S. PATENT DOCUMENTS 5,599,413 A  2/1997 Nakao et al.
6,219,245 B1  4/2001 Nagashima et al.
(Continued)

FOREIGN PATENT DOCUMENTS

JP  60-39374 A  3/1985
JP  63-177551 A  7/1988

OTHER PUBLICATIONS

Xun Gong, et al., "Investigation of Conducted EMI in SiC JFET Inverters Using Separated Heat Sinks", IEEE Transactions on Industrial Electronics, vol. 61, No. 1, Jan. 2014, pp. 115-125.

*Primary Examiner* — Alonzo Chambliss
(74) *Attorney, Agent, or Firm* — Oblon, McClelland, Maier & Neustadt, L.L.P.

(57) ABSTRACT

An electronics apparatus including a first substrate having a first surface and a second surface, a first switch connected to a second switch and soldered in series on the first surface of the first substrate creating a connection to allow switching between the first switch and the second switch at high frequency, an insulation having a third surface attached to the second surface of the first substrate, and a second substrate having a pocket of low permittivity located between the first switch and the second switch on a fourth surface of the insulation, the fourth surface being opposite to the third surface where the first switch and the second switch are located.

9 Claims, 9 Drawing Sheets

(51) Int. Cl.
*H01L 23/00* (2006.01)
*H01L 23/495* (2006.01)
*H01L 25/07* (2006.01)
*H01L 21/8228* (2006.01)

(52) U.S. Cl.
CPC ...... *H01L 23/49589* (2013.01); *H01L 25/072* (2013.01); *H01L 2224/32245* (2013.01); *H01L 2224/48091* (2013.01); *H01L 2224/48106* (2013.01); *H01L 2224/48225* (2013.01); *H01L 2224/73265* (2013.01); *H01L 2924/05032* (2013.01); *H01L 2924/05432* (2013.01); *H01L 2924/1715* (2013.01); *H01L 2924/17747* (2013.01); *H01L 2924/19041* (2013.01); *H01L 2924/19102* (2013.01); *H01L 2924/30105* (2013.01)

(56) References Cited

U.S. PATENT DOCUMENTS

| | | |
|---|---|---|
| 6,636,429 B2 | 10/2003 | Maly et al. |
| 7,038,289 B2 | 5/2006 | Marty et al. |
| 8,319,278 B1 | 11/2012 | Zeng et al. |
| 8,822,269 B2 * | 9/2014 | Hayashi .............. H01L 21/4853 174/256 |
| 8,932,928 B2 * | 1/2015 | Wang ................ H01L 29/41775 257/330 |
| 2011/0241135 A1 | 10/2011 | Kurui et al. |
| 2014/0001488 A1 * | 1/2014 | Perkins .................. H01L 25/16 257/77 |
| 2014/0070304 A1 | 3/2014 | Komiya et al. |
| 2015/0137378 A1 | 5/2015 | Wu et al. |

* cited by examiner

ELECTRONIC APPARATUS WITH POCKET OF LOW PERMITTIVITY MATERIAL TO REDUCE ELECTROMAGNETIC INTERFERENCE

BACKGROUND

Field of the Disclosure

This application relates generally to improvements in power electronics module. More particularly the present disclosure relates a direct bond copper modified to reduce the electromagnetic interference and noise.

Description of the Related Art

Power modules of power electronics may be utilized in electric vehicles (EV) and hybrid electric vehicles (HEV) as a charger (changing AC to DC), an inverter (changing DC to AC), and/or a converter (DC to DC).

The power modules such as the charger, converter, and inverter generate an electrical noise. The electric noise caused by parasitic capacitance in the power module is one of the major sources of noise. In particular, a parasitic capacitance associated with chips of the power modules may be a source of electrical noise. The electrical noise further propagates through the power module to other components.

The electric noise generated by the chips may propagate through the power module, and may interfere with other electronic devices of the vehicle. For example, the charger, the inverter, and the converter generate noise which may propagate and may interfere with other vehicle components, such as auxiliary electronics and/or an electric motor.

To mitigate the noise generated by the chips, conventional power modules may include one or more noise filters. Typically, the noise filters can be bulky and heavy, thereby increasing the weight and footprint of the power module. The noise filters may occupy a significant portion of the footprint of the power modules. As such, an improvement over current technology that will allow reducing or eliminating the need for large and bulky noise filters.

SUMMARY

According to an embodiment of the present disclosure, there is provided an electronic apparatus. The electronic apparatus including a first substrate having a first surface and a second surface, a first switch connected to a second switch and soldered in series on the first surface of the first substrate creating a connection to allow switching between the first switch and the second switch at high frequency, an insulation having a third surface attached to the second surface of the first substrate, and a second substrate having a pocket of low permittivity located between the first switch and the second switch on a fourth surface of the insulation, the fourth surface being opposite to the third surface where the first switch and the second switch are located.

The forgoing general description of the illustrative implementations and the following detailed description thereof are merely exemplary aspects of the teachings of this disclosure, and are not restrictive.

BRIEF DESCRIPTION OF THE DRAWINGS

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying graphs and figures are for illustration purposes only and may or may not represent actual or preferred values or dimensions. Where applicable, some or all features may not be illustrated to assist in the description of underlying features. In the drawings.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details. In some instances, well-known structures and components may be shown in block diagram form in order to avoid obscuring the concepts of the disclosed subject matter.

Reference throughout the specification to "one embodiment" or "an embodiment" means that a particular feature, structure, or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments. Further, it is intended that embodiments of the disclosed subject matter cover modifications and variations thereof.

It must be noted that, as used in the specification and the appended claims, the singular forms "a," "an," and "the" include plural referents unless the context expressly dictates otherwise. That is, unless expressly specified otherwise, as used herein the words "a," "an," "the," and the like carry the meaning of "one or more." Additionally, it is to be understood that terms such as "top," "bottom," and the like that may be used herein merely describe points of reference and do not necessarily limit embodiments of the present disclosure to any particular orientation or configuration. Furthermore, terms such as "first," "second," "third," etc., merely identify one of a number of portions, components, steps, operations, functions, and/or points of reference as disclosed herein, and likewise do not necessarily limit embodiments of the present disclosure to any particular configuration or orientation.

Figure 1:
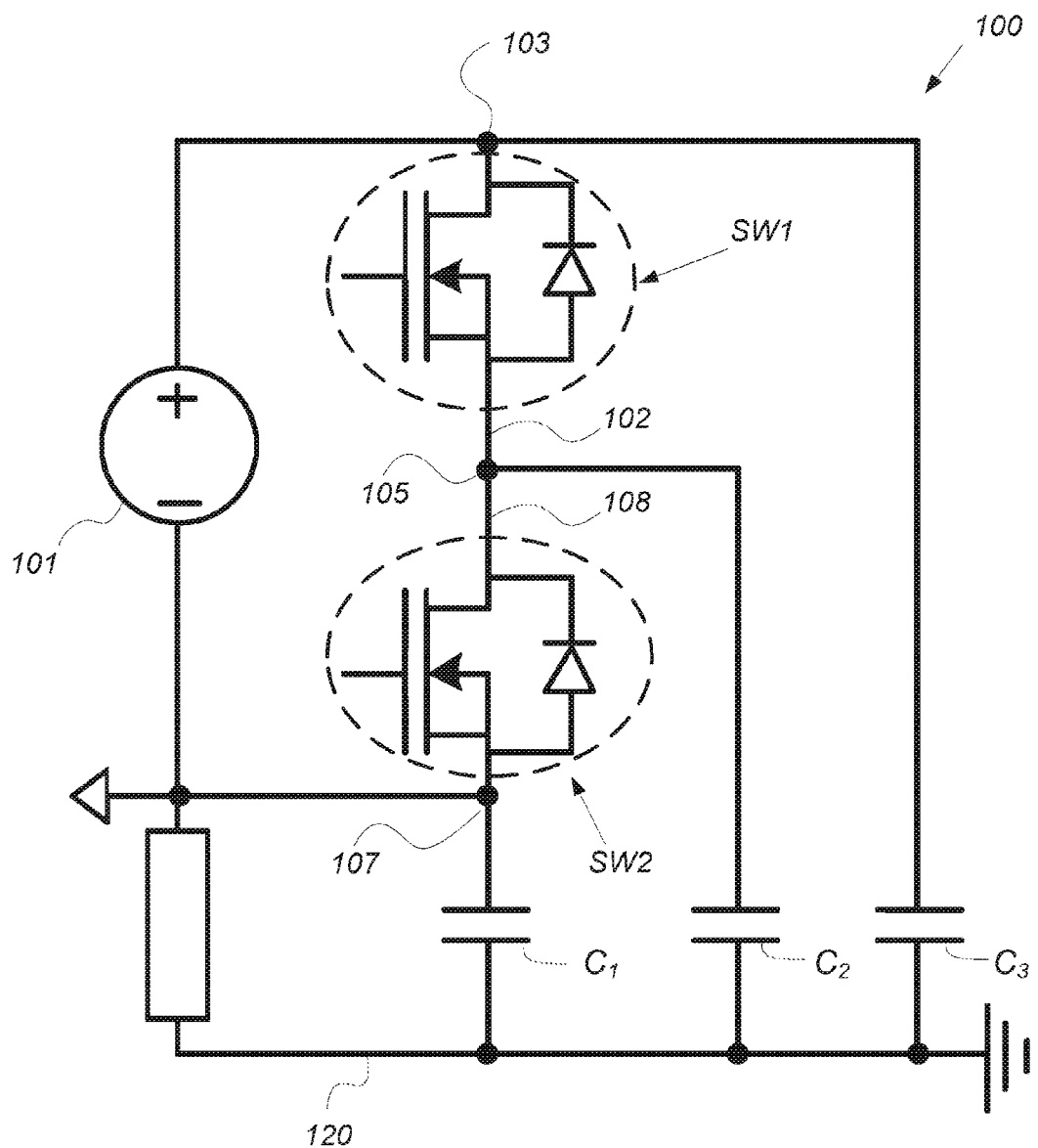
FIG. 1 is an exemplary circuit of power electronics according to the background art.

FIG. 1 is an exemplary circuit of a power electronic device. The circuit 100 can include a power supply 101, a first switch SW1 and a second switch SW2. A positive (+) of the power supply 101 can be connected to a first drain 103 on the top surface of the first switch SW1. A negative (−) of the power supply 101 can be connected to a second source 107 of the second switch SW2. The first switch SW1 and the second switch SW2 can be connected in series by electrically connecting a first source 102 of the first switch SW1 to a second drain 108 of the second switch SW2. The connection between the first switch SW1 and the second switch SW2 creates a high frequency point 105 during operation of the power electronics. The high frequency point 105 experiences a voltage change at a high frequency due to switching between the first switch SW1 and the second switch SW2 at a high frequency. The high frequency can range from kilohertz to gigahertz depending on the rated power of a system employing the power electronics. The high frequency point 105 can be a significant source of noise and electromagnetic interference in the circuit 100 which can transmit the noise and cause electromagnetic interference with other electric component of power electronics.

An electrical connection between different elements of the circuit 100 creates several parasitic capacitances. For example, a first capacitance $C_1$, a second capacitance $C_2$, and a third capacitance $C_3$ are created in the circuit 100. The first capacitance $C_1$ exist between the second source 107 of the second switch SW2 and a substrate 120, the second capacitance $C_2$ exist between the high frequency point 105 and the substrate 120, and the third capacitance $C_3$ exist between the first drain 103 and the substrate 120.

Figure 2:
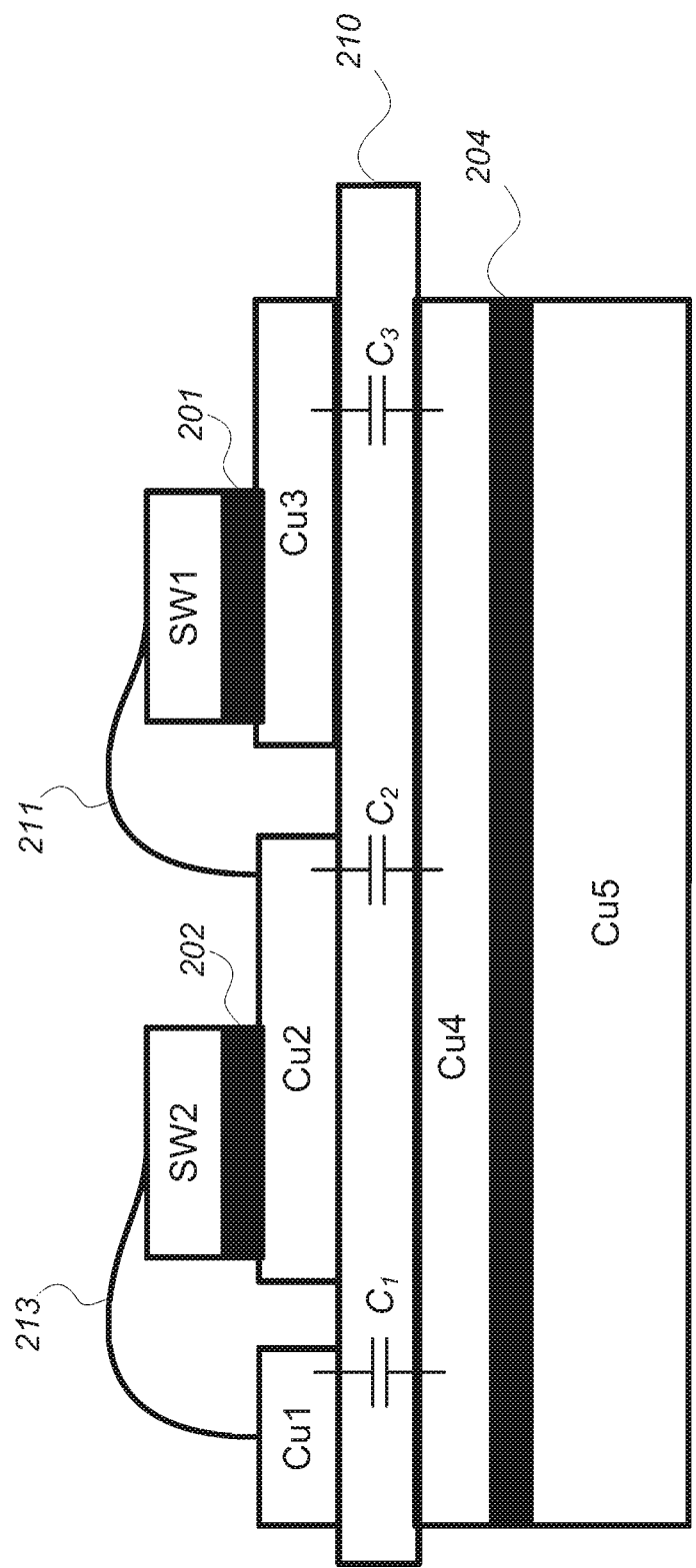
FIG. 2 illustrates a cross-section of the exemplary circuit of power electronics according to the background art.

FIG. 2 illustrates a cross-section of the circuit 100 of the power electronic device. The power electronic device 100 can include a first substrate Cu1, a second substrate Cu2, and a third substrate Cu3 attached on a first surface (above) an insulation 210. On a second surface (below) the insulation 210, a fourth substrate Cu4 can be attached. Further, the fourth substrate Cu4 can be soldered to a fifth substrate Cu5 via a third solder 204. The fifth substrate Cu5 can dissipate the heat generated during operation of the power electronics. The substrates Cu1-Cu5 can be electric conductors made of material such as copper, while the insulation 210 can be made of ceramic, aluminum oxide ($Al_2O_3$), aluminum nitride (AlN), or the like. The first switch SW1 and the second switch SW2 can be soldered to the second substrate Cu2 and the third substrate Cu3, respectively, on the first surface of the insulation 210 to create the circuit 100. Typically, the switches SW1 and SW2 are soldered to different substrates. However, in one embodiment, the substrates Cu1-Cu3 can be configured differently to create the circuit 100. For instance, the first switch SW1 and the second switch SW2 can be soldered to a single substrate such as the second substrate Cu2 and the third substrate Cu3 can be eliminated.

The first switch SW1 can be soldered to the third substrate Cu3 via a first solder 201, and the second switch SW2 can be soldered to the second substrate Cu2 via a second solder 202.

Further, the first switch SW1 and the second switch SW2 can be electrically connected for example, in a series using bond wires. For example, a first bond wire 211 creates a connection between the first switch SW1 soldered on a third substrate Cu3 and the second substrate Cu2, on which the second switch SW2 is soldered. The second switch SW2 can be connected to the first substrate Cu1 by a second bond wire 213 to complete the circuit 100. As such, the first capacitance $C_1$ is created between the first substrate Cu1 and the fourth substrate Cu4. The second capacitance $C_2$ is created between the second substrate Cu2 and the fourth substrate Cu4. The third capacitance $C_3$ is created between the third substrate Cu3 and the fourth substrate Cu4. The first, second, and third capacitances $C_1$, $C_2$, and $C_3$, respectively, include similar dielectric material i.e., the insulation 210. The second capacitance $C_2$ is associated with the high frequency point 105, as discussed earlier.

Figure 3A:
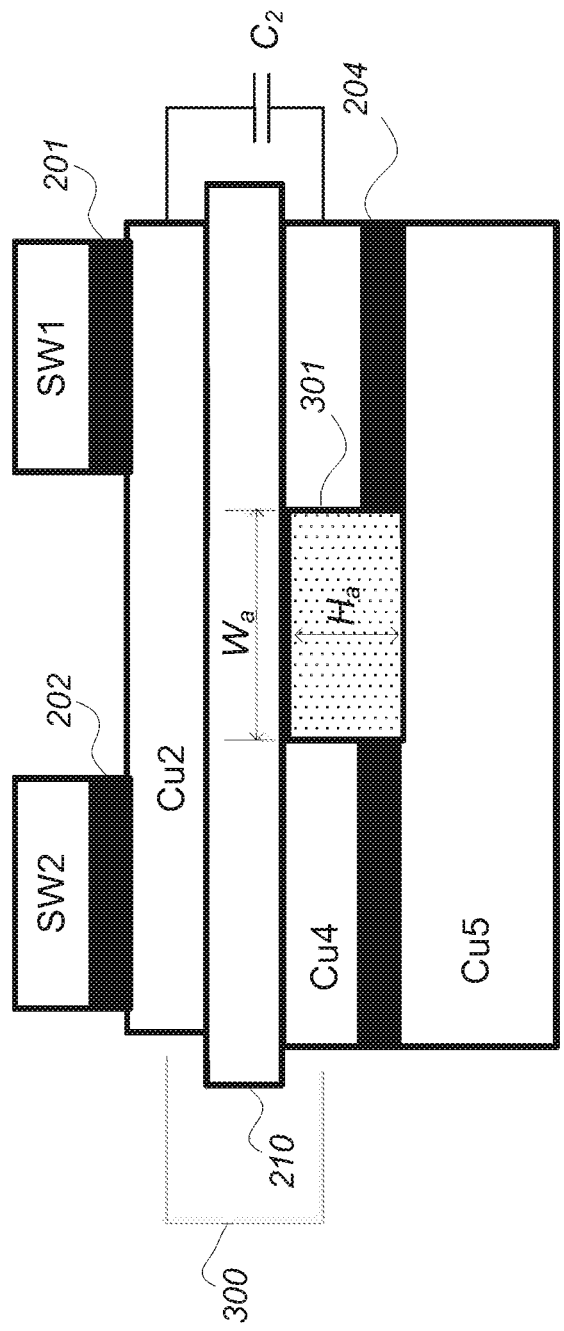
FIG. 3A illustrates a first configuration of a direct bond copper of the power electronics according to certain embodiments of the present disclosure.

The inventors discovered that part of the power electronics (referred as direct bond copper later in the present disclosure) around the second capacitance $C_2$ can be modified to reduce the parasitic capacitance in order to reduce the source of the noise and electromagnetic interference. FIG. 3A illustrates a direct bond copper 300 of the power electronics according to certain embodiments of the present disclosure. The direct bond copper 300 (DBC 300 hereinafter) refers to a part of the power electronics formed by the first switch SW1 and the second SW2 soldered to the second substrate Cu2 on the first surface of the insulation 210, while the second surface of the insulation 210 is attached to the fourth substrate Cu4. The DBC 300 includes a parasitic capacitance such as the second capacitance $C_2$. To reduce the parasitic capacitance, a low permittivity material such as an air pocket 301 of a height $H_a$ and a width $W_a$ can be formed in the fourth substrate Cu4 on the second surface of the insulation 210, i.e., a surface opposite to the first surface, where the switches SW1 and SW2 are located. The low permittivity material can be any material having permittivity less than the surrounding substrate. The low permittivity material in solid, liquid or gaseous form. For instance, air (gaseous form) has a permittivity lower than the surrounding substrates Cu2, Cu4, solder, etc. In one embodiment, the low permittivity material can be polyimides, $SiO_2$, poly (aryl ethers), polynorbornene, polytetrafluoroethylene, or other polymers that are designed to have low permittivity as well as improved thermal and mechanical properties.

The dimensions of the pocket of low permittivity material depend on the size of the circuit 100. In one embodiment of the present disclosure, the volume of the air pocket is 3.82e-9 m3, and the ratio of air pocket area to the total DBC area is 16.5%.

In one embodiment, the air pocket 301 can be positioned in proximity of the high frequency point 105 (in FIG. 1), which corresponds to an area between the switches SW1 and SW2 in FIG. 3A. In one embodiment, the air pocket 301 is positioned below the insulation 210 in the fourth substrate Cu4. The air pocket 301 can be further extended into the third solder 204. In FIG. 3C, the air pocket 301 is completely enclosed by the insulation 210 on one surface and the second substrate Cu2. Alternatively or in addition, the air pocket 301 can be extended into the fifth substrate Cu5, in which case the air pocket 301 will be completely enclosed by the insulation 210 on one surface and the fifth substrate Cu4. The air pocket 301 extends in a lateral direction (i.e., perpendicular to the plane of paper) along the length of the fourth substrates Cu4 forming a channel. The air pocket 301 is not positioned directly beneath the first switch SW1 and the second switch SW2. The air pocket 301 may be formed into an intermediate copper layer such as the fourth substrate Cu4 and the solder 204 through an etching process. In one embodiment, the air pocket 301 is rectangular in shape. It is understood that while a rectangular shape may be intended, the actual manufactured shape may have slight deviations in practice, for instance, rounded edges, jagged edges, etc. Further, an air pocket of any other shape (e.g., ring-like, circular, semicircular, triangular, etc.) and size can be formed. The DBC 300 having the air pocket 301 can be manufactured using traditional etching process used to fabricate integrated circuits. In one embodiment, more than one pocket of low permittivity can be formed in the circuit, as illustrate in FIG. 3B. In addition, each of the more than one pockets of low permittivity can be filled with different permittivity material.

Figure 3B:
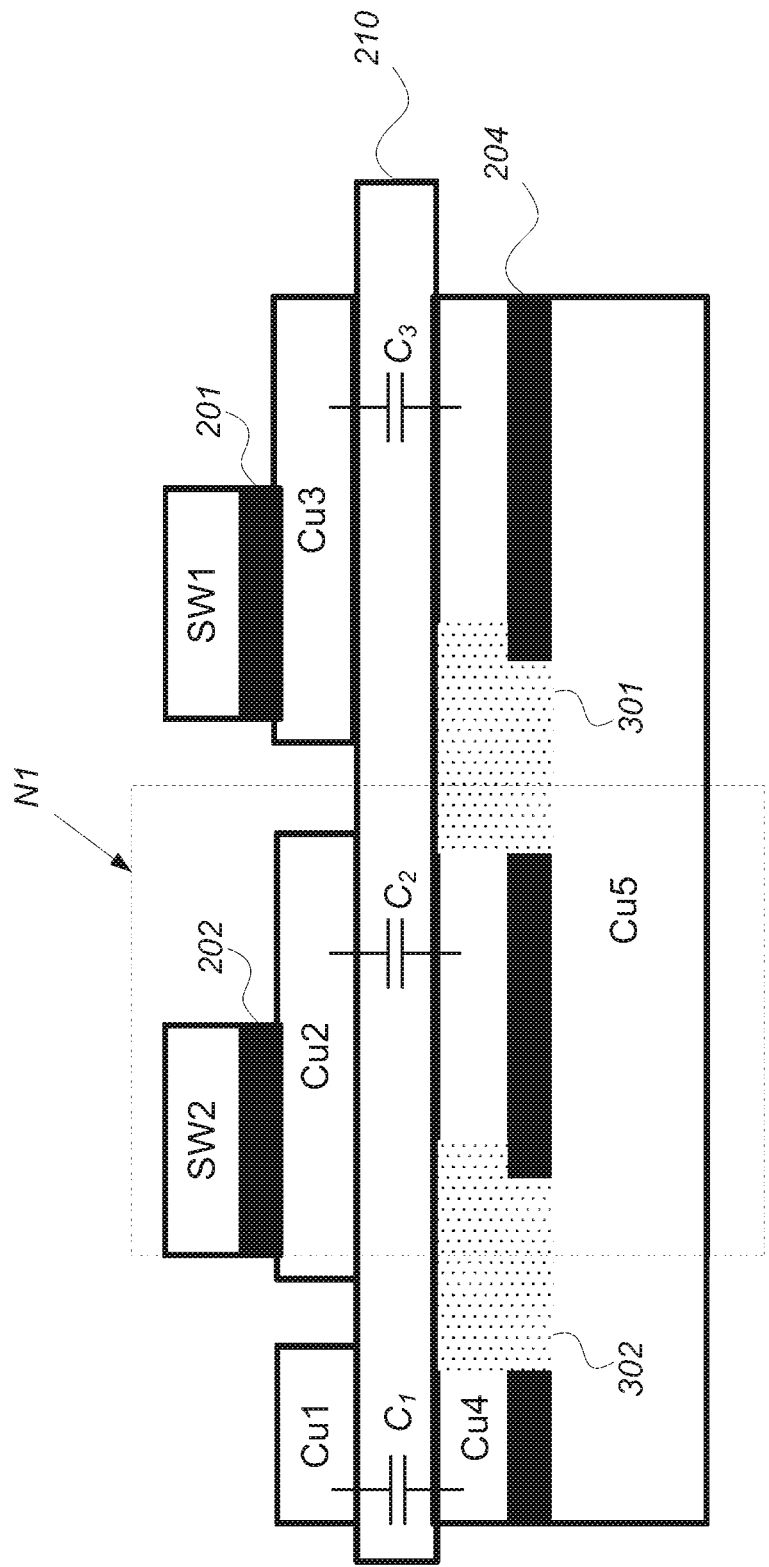
FIG. 3B illustrates a second configuration of a direct bond copper of the power electronics according to certain embodiments of the present disclosure.
Figure 3C:
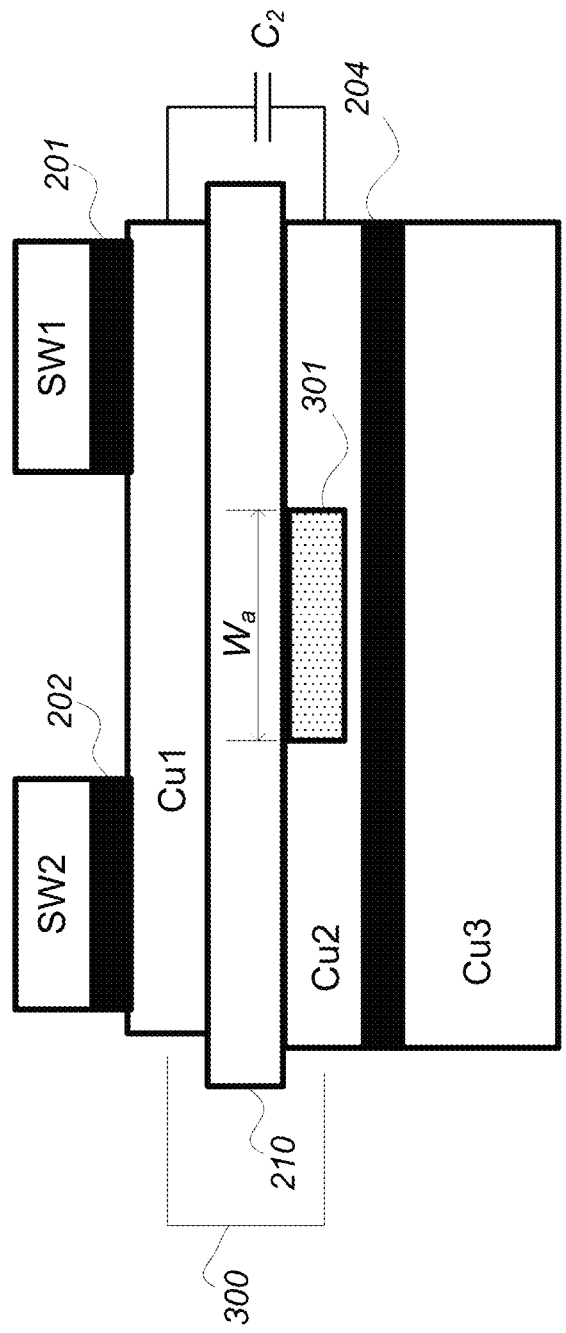
FIG. 3C illustrates a variation of the first configuration with air pocket completely enclosed by the insulation and the second substrate according to certain embodiments of the present disclosure.
Figure 4:
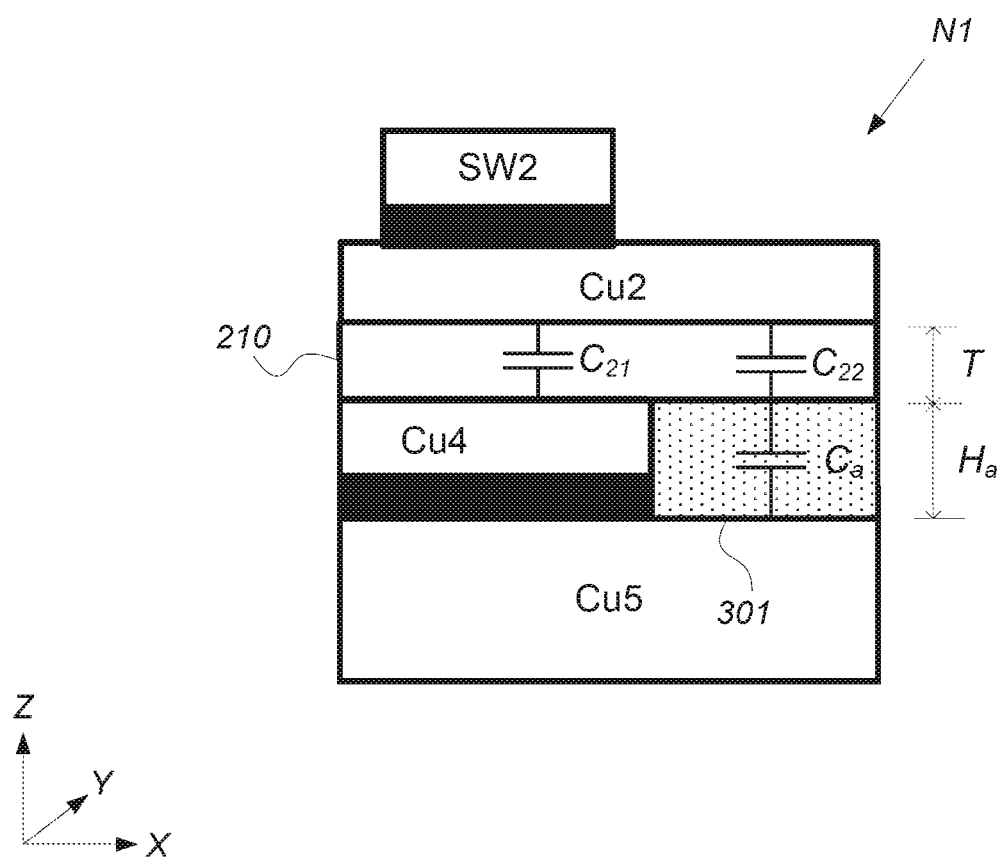
FIG. 4 illustrates an equivalent capacitance generated due the presence of an air pocket according to an exemplary embodiment of the present disclosure.

FIG. 3B illustrates a second configuration of a direct bond copper of the power electronics according to certain embodiments of the present disclosure. The second configuration can include more than one pocket of low permittivity material, such as air pockets 301 and 302. The air pockets 301 and 302 are in the vicinity of high frequency region of the circuit and in the path of noise propagation. The pocket of low permittivity material causes a change in capacitance of the circuit. For instance, the capacitance of a node N1 can be evaluated, as illustrated in FIG. 4. The node N1 is a cross-section of the circuit having at least one pocket of low permittivity material such as air pocket 301.

FIG. 4 illustrates an equivalent capacitance of the node N1 generated due the presence of the air pocket 301 according to an exemplary embodiment of the present disclosure. The node N1 includes a part of the second substrate Cu2, a part of the fourth substrate Cu4 having an area $A_2$, the air pocket 301 having an area $A_{air}$, and a fifth substrate Cu5. The node N1 can have a total area $A_x$. The total area $A_x$ can be a maximum area of the fifth substrate Cu5, or the area of the second substrate Cu2. The areas $A_2$, $A_x$ and $A_{air}$ can be calculated in the x-y plane, as indicated in the FIG. 4. The capacitances within the node N1 include a capacitance $C_{21}$ between the second substrate Cu2 and the fourth substrate Cu4 separated by the insulator 210, a capacitance $C_{22}$ between the second substrate Cu2 and the air pocket 301. Further, the air pocket 301 can have a capacitance $C_a$, which is formed in series with the capacitance $C_{22}$. The resulting capacitance $C_2$ of a part of the power electronics device that includes the air pocket 301 can be defined by the equation 1 below, $$C_2' = C_{21} + \frac{C_{22} * C_a}{C_{22} + C_a} \quad (1)$$

Where, the capacitance $C_{21}$ is substantially equal to a product of the permittivity (i.e, $\varepsilon_{insulator}$) Of the insulator 210 and the ratio of the area $A_2$ and thickness T of the insulator 210, the capacitance $C_{22}$ is substantially equal to a product of the permittivity of the insulator 210 and the ratio of the area $A_{air}$ and thickness T of the insulator 210, and the capacitance $C_a$, which represents the capacitance across the low permittivity material such as the air pocket 301, is substantially equal to a product of the permittivity of the low permittivity material (e.g. for air the permittivity is $\varepsilon_{air}$) and the ratio of the area $A_{air}$ and height $H_a$ of the air pocket 301.

The resulting capacitance $C_2'$ is a function of the area of the low permittivity material (i.e., the area of the air pocket 301), the area of different elements of the power electronics, as well as the thickness T of the insulation 210 and the height of the air pocket 301. In the absence of the air pocket 301, the second capacitance $C_2$ of a part of the power electronics device can be defined by the equation 2 below, $$C_2 = \varepsilon_{insulator} * \frac{A_x}{T} \quad (2)$$

Typically, the capacitance $C_a$ is lower than the capacitances $C_1$, and $C_2$. As such, the resulting capacitance $C_2'$ is lower than the second capacitance $C_2$. Thus, the air pocket 301 reduces the capacitance of the power electronics, particularly beneath the first and second switches SW1 and SW2, respectively.

The reduced capacitance, particularly at the high frequency point, causes a reduction in noise level and electromagnetic interference that prorogates to connected components of the power electronics. The noise level can be reduced significantly enough to reduce or even omit the use of a noise filter. Noise filters are commonly used in electronics circuits to reduce the noise generated during operation of the power electronics and can occupy 30% to 50% of the area of a power electronics. As such, by employing the DBC 300 with the air pocket 301 the size and weight of the power electronics can be significantly reduced.

Figure 5A:
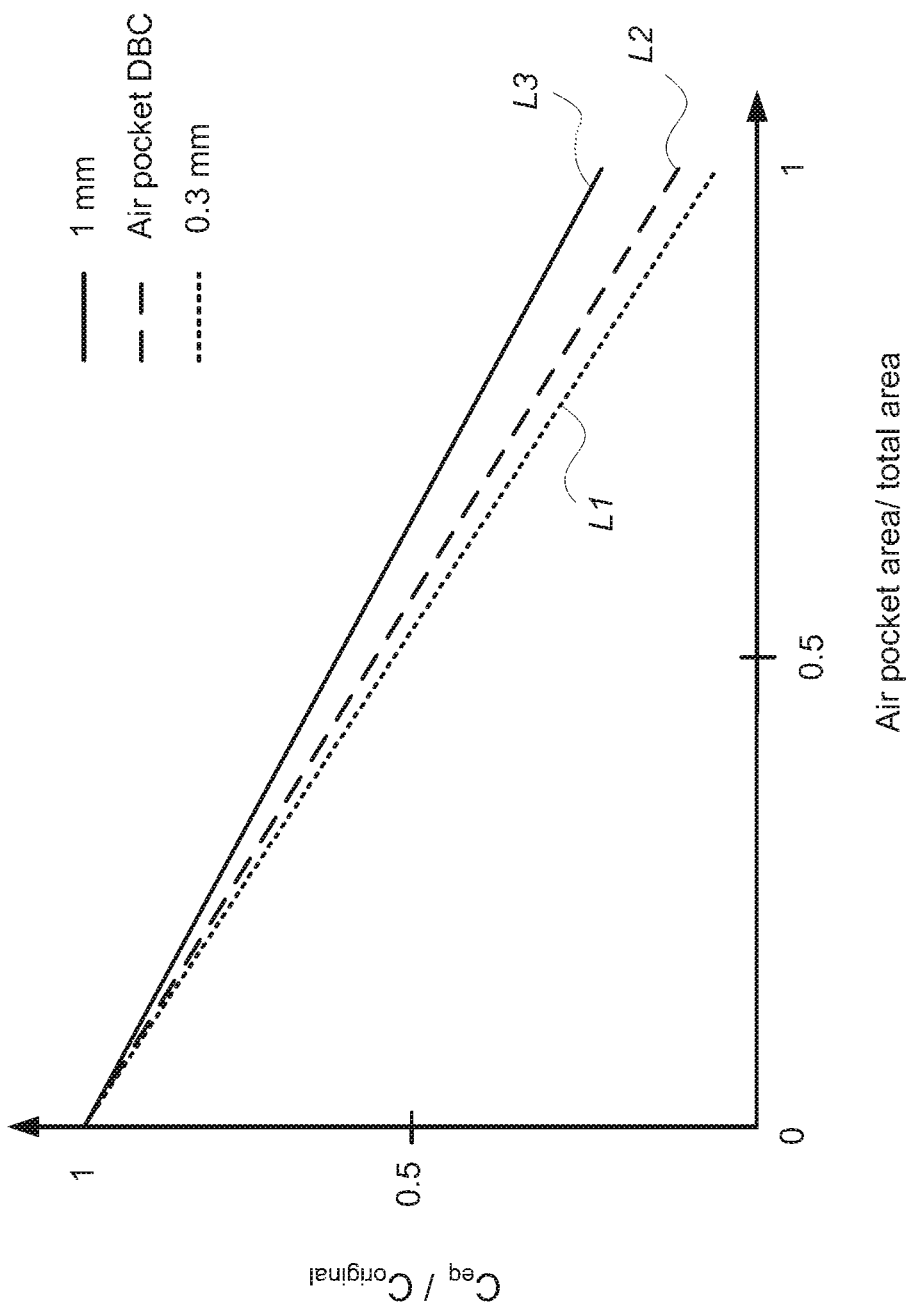
FIG. 5A is a graph illustrating the effect of the air pocket on a capacitance of the power electronics according to an embodiment of the present disclosure.

FIG. 5A is a graph illustrating the effect of the air pocket 301 on a capacitance of the power electronics according to an embodiment of the present disclosure. In FIG. 5A, L1 indicates a change in the resulting capacitance $C_2'$ as a function of a change in the area of the DBC 300, in which the thickness T of the insulation 210 is maintained at 1 mm and the air pocket 301 is not present. L2 indicates a change in the equivalent capacitance $C_{eq}$ when the air pocket 301 is present in the DBC 300. L3 indicates a change in the resulting capacitance $C_2'$ as a function of the change in the area of the DBC 300, in which the thickness T of the insulation 210 is maintained at 0.3 mm and the air pocket 301 is not present. Comparing L2 and L3 shows that, when the air pocket 301 is present in the DBC 300, the resulting capacitance $C_2'$ reduces more sharply as the area (or volume) of the air pocket 301 increases relative to the area (or volume) of the DBC 300. A similar effect is observed between L2 and L3.

Figure 5B:
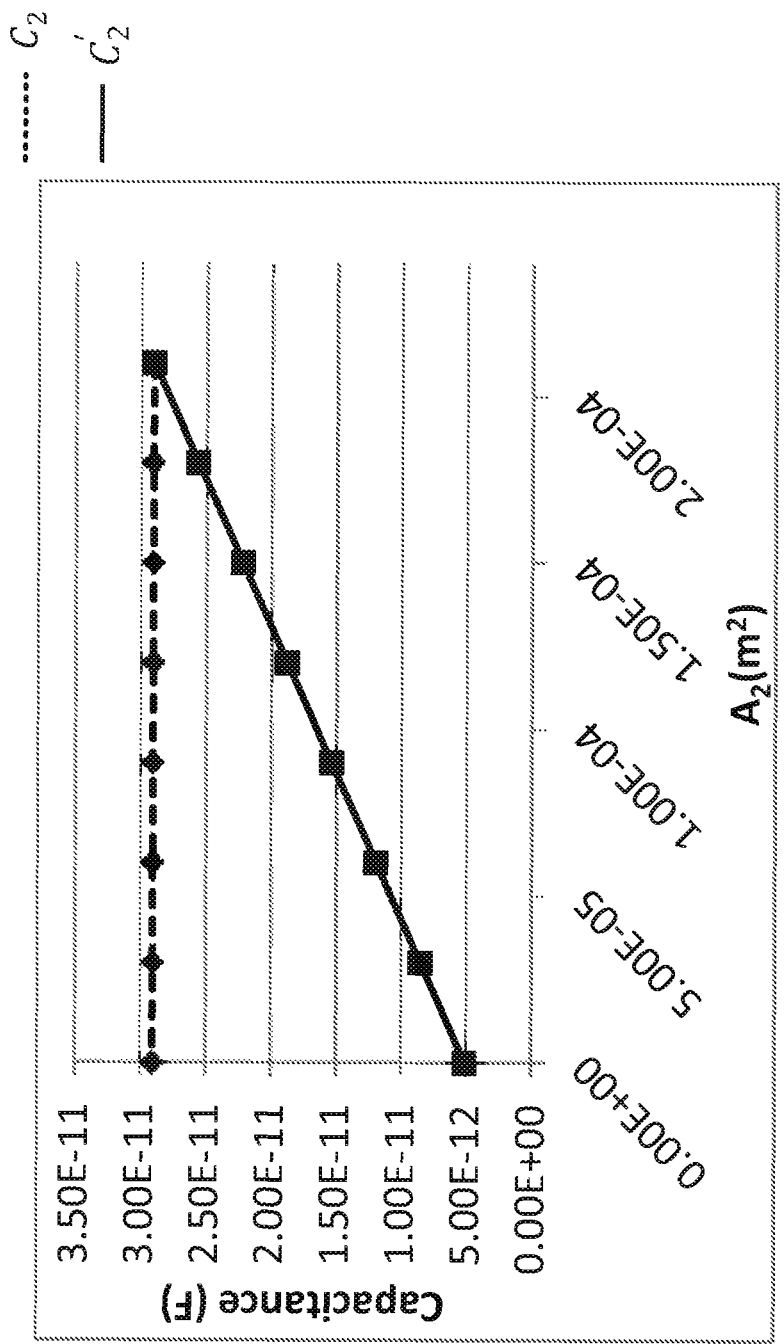
FIG. 5B is a graph illustrating the effect of increase in the air pocket area on a resulting capacitance of the power electronics according to an embodiment of the present disclosure.

FIG. 5B is a graph illustrating the effect of increase in the air pocket area on a resulting capacitance of the power electronics according to an embodiment of the present disclosure. The graph indicates that as the area $A_2$ decreases (as a result of increase in the air pocket's 301 area $A_{air}$), the resulting capacitance $C_2'$ decreases rapidly compared to the second capacitance $C_2$ (i.e., capacitance when the air pocket 301 is not present). As such, the power electronics with reduced capacitance (i.e., the resulting capacitance $C_2'$) causes less electromagnetic interference or noise propagation compared to a conventional power electronics having the second capacitance $C_2$. The resulting capacitance $C_2'$ can decrease in a linear manner or non-linear manner depending on the type of low permittivity material and the dimensions of the air pocket.

Figure 6:
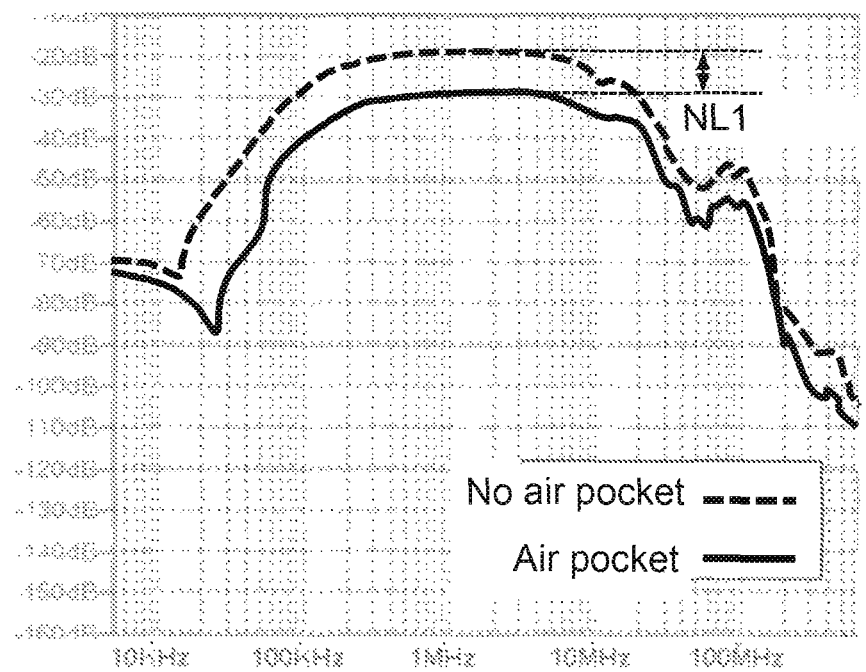
FIG. 6 is a graph illustrating the effect of air pocket on a noise level of the power electronics according to an embodiment of the present disclosure.

FIG. 6 is a graph illustrating the effect of the air pocket 301 on a noise level of the power electronics. In FIG. 6, the dotted line corresponds to a noise level observed as the frequency changes for a power electronics with the second capacitance $C_2$ (i.e., when the air pocket 301 is not present). The solid line corresponds to a noise level observed as the frequency changes for a power electronics with the resulting capacitance $C_2'$ (i.e., when the air pocket 301 is present). The plots show that the peak noise reduces by a noise level NL1 (e.g., 10 dB) when the air pocket 301 is present in the DBC 300 of the power electronics. Further, the plots show that the noise level over the entire frequency range of power electronics that includes the air pocket 301 is always lower than the noise level when an air pocket is not present.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures.

What is claimed is:

1. An electronics apparatus comprising:
   a first substrate including a first surface and a second surface;
   a first switch connected to a second switch and soldered in series with the first switch on the first surface of the first substrate creating an electrical connection to allow high frequency switching between the first switch and the second switch;
   insulation including a first surface attached to the second surface of the first substrate; and
   a second substrate having a pocket of low permittivity material located between the first switch and the second switch on a second surface of the insulation, the second surface of the insulation being opposite to the first surface of the insulation where the first switch and the second switch are located.

2. The apparatus according to claim 1, wherein the pocket of low permittivity material formed of an air pocket is completely enclosed by the insulation and the second substrate.

3. The apparatus according to claim 2, wherein the air pocket is substantially rectangular in shape located directly below the electrical connection.

4. The apparatus according to claim 2, wherein the air pocket extends along the length of the second substrate.

5. The apparatus according to claim 2, wherein a first capacitance is formed between the first substrate and the second substrate and a second capacitance corresponding to the air pocket is formed in series with the first capacitance causing a reduction in an overall capacitance of the electronics apparatus.

6. The apparatus according to claim 1, wherein the first substrate is made of copper.

7. The apparatus according to claim 1, wherein the second substrate is made of copper.

8. The apparatus according to claim 1, wherein the second substrate is soldered to a third substrate to transfer heat generated during operation.

9. The apparatus according to claim 1, wherein the insulation has uniform thickness under the first switch and the second switch.

* * * * *